United States Patent [19]

Felten

[11] 4,230,493

[45] Oct. 28, 1980

[54] GOLD CONDUCTOR COMPOSITIONS

[75] Inventor: John J. Felten, Lewiston, N.Y.

[73] Assignee: E. I. Du Pont de Nemours and Company, Wilmington, Del.

[21] Appl. No.: 944,895

[22] Filed: Sep. 22, 1978

[51] Int. Cl.$^3$ ............................................. C09D 5/24
[52] U.S. Cl. ................................. 106/1.13; 106/1.14; 106/1.18; 106/1.19; 106/1.26; 106/193 M; 252/514; 260/42.22
[58] Field of Search ................... 106/1.13, 1.14, 1.18, 106/1.19, 1.26, 193 M; 252/514; 260/42.22

[56] References Cited

U.S. PATENT DOCUMENTS

| | | | |
|---|---|---|---|
| 2,822,279 | 2/1958 | Larsen et al. | 252/514 |
| 3,776,769 | 12/1973 | Buck et al. | 106/1.13 |
| 3,966,463 | 6/1976 | Fraioli et al. | 75/108 |
| 4,004,057 | 1/1977 | Hoffman et al. | 106/1.13 |
| 4,032,350 | 6/1977 | Greenstein | 106/1.13 |

*Primary Examiner*—Lorenzo B. Hayes

[57] ABSTRACT

Superior thick film gold conductor compositions useful in electronic microcircuits containing small amounts of silver. Improved properties prior to heat aging include surface characteristics, malleability and electrical conductivity. Improved properties of thermally aged aluminum wire bonds include adhesion, electrical continuity and electrical conductivity.

9 Claims, No Drawings

GOLD CONDUCTOR COMPOSITIONS

DESCRIPTION

Technical Field

This invention relates to thick film gold conductor compositions useful in electronic microcircuits, particularly for connecting silicon chip integrated circuits via aluminum wire bonding to terminals. Ultimate use for such microcircuitry includes applications where interconnect reliability is of prime importance and where material considerations dictate the use of ultrasonic aluminum wire bonding. Examples of such end uses would be high reliability hybrid microcircuitry in military and aerospace applications, medical electronics, telecommunications and computers.

Background Art

With the introduction of integrated circuits it became desirable to connect active devices to thick film metallizations by means of fine wires. These wires are attached to the active devices and thick film metallizations by means of thermal energy, mechanical compression, ultrasonic energy or a combination thereof. Gold wires have long been used to attach active devices to gold metallizations. Aluminum wires are an attractive alternative but the mechanical strength and electrical conductivity of aluminum wires attached directly to gold has been found to be poor after thermal aging. Generally, when such bonds are heat aged for from 50 to 250 hours at approximately 150° C., bond strength decreases by one-half to two-thirds, and electrical resistance increases by as much as tenfold.

Metallizations made from thick film gold conductor compositions with relatively low levels of palladium added, approximately 2-3% by weight, were found to effectively counter these problems; the bond degradation is inhibited to the extent that useful bond life can be extended past 1000 hours, when subjected to heat aging at 150° C. However, metallizations made from palladium containing thick film gold conductor compositions suffer from several other disadvantages, which can be particularly significant in certain applications:

(1) Palladium tends to harden the gold conductor metallization, rendering the gold conductor metallization less malleable and therefore requiring more energy to achieve the necessary initial intimate contact with the aluminum wire interconnector.

(2) Palladium tends to significantly increase the electrical resistivity of the gold conductor metallizations; palladium, when present in amounts of approximately 2-3% by weight, will increase the resistivity of gold conductor metallizations approximately twofold.

Typical of palladium containing thick film gold conductor compositions are those described in Horowitz, S.J. et al, Alloy Element Additions to Gold Thick Film Conductors: Effects on Indium/Lead Soldering and Ultrasonic Aluminum Wire Bonding, Proceedings 1977, 27th Electronic Components Conference, May 16-18, 1977, and Solid State Technology, Vol. 21, p. 47 (Jan. 1978).

DISCLOSURE OF THE INVENTION

In the following disclosure all parts and percentages are by weight, unless stated otherwise.

The present invention relates to thick film gold conductor compositions, processes for making such compositions, processes for making fired metallizations from such compositions, and electronic microcircuits made from such compositions. In particular, the compositions of the present invention comprise intimate mixtures of gold powder, silver powder, binder and organic vehicle. In addition, thixotropes, wettings agents, dispersing agents and stabilizers can be incorporated as desired.

In metallizations made from the palladium containing thick film gold conductor compositions referred to above, it has generally been found that satisfactory electrical and physical properties of heat aged bonds (bonds of aluminum wire interconnectors to thick film gold conductor compositions which have been aged for up to 1000 hours at approximately 150° C.) are not achieved unless the palladium is present in the composition in an amount of at least 2%, more commonly 2.5-3%.

The present invention is based upon the unexpected discovery that thick film gold conductor compositions containing silver in amounts as small as 0.5% are as effective as otherwise equivalent compositions containing palladium in amounts of approximately 2.5%, in achieving satisfactory electrical and physical properties of heat aged aluminum/gold bonds. The metallizations made from silver containing thick film gold conductor compositions of the present invention have the further advantages of:

(1) being significantly softer and more malleable than palladium containing compositions with comparable heat aging properties, thus making it easier to achieve the necessary initial intimate contact with the aluminum wire interconnectors; and (2) being significantly more electrically conductive than palladium containing compositions with comparable heat aging properties, thus permitting thinner films for a given application and considerable savings in terms of cost of materials.

The success of this invention is unexpected because of the tendency of silver under conditions of high humidity to migrate and short conductor lines in metallizations containing large amounts of silver. Manufacturers of thick film circuits have generally avoided the use of silver in gold bearing compositions because of this tendency to migrate. In the present invention, however, it has been found that an additive level of silver that is too low to cause shorting confers a significant performance advantage over a pure gold metallization or a gold metallization containing palladium.

The gold powder used in the compositions of the present invention can be any of the gold powders commercially available and specifically intended for use in thick film gold conductor compositions. See, for example, Englehard Gold Bulletin and Thomas Register, Vol. 3, pp. 4397-99 (1978). Generally, the gold powder will consist of gold particles approximately spherical in shape and preferably ranging in size from about 0.5 to about 5 microns in diameter. It is generally understood in the art that in specifying a particular micron range for powders, including metal and inorganic powder, such as glasses, oxides, etc., not all particles will be within that range, but, generally at least 90% of the powder will consist of particles within the specified range. Preferably, the powder will contain trace amounts of wetting agent, such as cyanoguanidine, evenly dispersed throughout the powder, for example as would be achieved by mixing under moderate shear for a short period of time, e.g., 1-5 minutes, as in a blender. See, for example, U.S. Pat. No. 3,966,463, granted June 29, 1976, to Fraiolli et al, Example I.

The silver powder used in the compositions of the present invention will generally consist of silver particles, approximately spherical in shape, preferably approximately 0.1 to 10 microns in diameter. Alternately, the silver can be provided as silver resinate or silver oxide powder which will decompose during subsequent firing to produce elemental silver.

The binder can be any one or more of those binders generally used in conventional thick film gold conductor compositions including metal oxide powders, such as finely divided copper oxide, cadmium oxide or bismuth oxide, and glass binders, such as disclosed in U.S. Pat. No. 4,004,057, granted Jan. 18, 1977 to Hoffman et al. The metal oxide powders consist of finely divided particles, preferably ranging in size from about 0.5 to about 5 microns in diameter. The metal oxide powder can also be formulated with trace amounts of wetting agent, such as cyanoguanidine, evenly dispersed throughout the powder, for example as would be achieved by mixing under localized high shear for long periods of time, e.g., 4–24 hours, as in a ball mill.

The organic vehicle used in the thick film gold conductor compositions of the present invention can be any of those generally used in conventional gold conductor compositions including solutions or dispersions of resins, such as ethyl cellulose resin, polybutyl methacrylate, poly-α-methyl styrene or poly(ethylene vinyl acetate). Suitable solvents or disperion mediums must be physically compatible with the resin and the resulting solution or dispersion must be chemically inert with respect to the other components of the gold conductor composition. Any one of various organic liquids, with or without thickening and/or stabilizing agents and/or other common additives (e.g., thixotropes and wetting agents) can be used as the carrier for the organic resin. Suitable organic liquids include aliphatic alcohols (e.g., 1-decanol), esters of such alcohols (e.g., acetates or propionates), glycol ethers (e.g., dibutyl carbitol), terpines (e.g., pine oil or terpineol), and di-alkyl phthalates (e.g., di-butyl phthalate or di-methyl phthalate). Preferred thixotropes include hydrogenated castor oil. Preferred wetting agents include soya lecithin, triethanolamine, and tributyl phosphate. Stabilizers can be added to prevent oxidation and degradation by acid by-products, i.e., to stabilize viscosity or to help buffer the pH. Examples of suitable stabilizers include triethanolamine and 2,6-di-t-butyl-4-methyl phenol (e.g., Shell Ionol ®).

Generally, the gold powder comprises 75 to 90% of the gold conductor composition, preferably 80–88% and more preferably 82 to 86%. The silver powder comprises 0.1 to 4%, preferably 0.25–2% and most preferably 0.5–1% of the composition of the present invention. While the full benefit of the present invention is most efficiently achieved by incorporating silver as the only metallic additive to the gold composition, substantial benefit can still be achieved even if small quantities of other metals, e.g., platinum or copper oxide, are added to the gold composition, either instead of a portion of the silver additive or in addition to such silver additive. By way of example, platinum can be added in amounts of up to about 4% or copper oxide can be added up to about 1%. Alternatively, mixtures of platinum and copper oxide can be added up to a total of about 4%. Preferably, the silver powder is the only metallic additive.

Metal oxide binders will comprise about 0.3–3%, preferably 1.5–2.5%, most preferably approximately 2%. Optionally, glass binder may be added to or used instead of the metal oxide binder. When glass binder is present, the total quantity of binder should comprise about 0.25–5%, preferably about 2–4% of the composition.

The remainder of the composition comprises the organic vehicle which may contain up to 2% thixotrope, up to 1% wetting agent and/or dispersing agent, and up to 1% stabilizing agent, each of these percents being based on the total composition. Preferably, one or more of these additives are used in amounts of approximately 0.1% each. The concentration of resin in the organic liquid should be about 2–15%, preferably 3–12%, most preferably 7–11%. Ethyl cellulose is preferred.

In the preparation of the compositions of the present invention, the inorganic solids are mixed with the organic carrier and dispersed with suitable equipment, such as a three-roll mill, to form a suspension, resulting in a gold composition for which the viscosity will be in the range of about 100–300 pascal-seconds at a shear rate of 4 sec$^{-1}$.

The composition is then applied to a substrate, such as alumina ceramic, by the process of screen printing to a wet thickness of about 30–80 microns, preferably 35–70 microns, most preferably 40–50 microns. The printed patterns are then dried at about 80°–150° C. for about 5–15 minutes. Firing is preferably done in a belt conveyor furnace with a temperature profile that will allow burnout of the organic matter at about 300°–600° C., a period of maximum temperature of about 800°–1050° C. lasting about 5–15 minutes, followed by a controlled cooldown cycle to prevent over-sintering, unwanted chemical reactions at intermediate temperatures or substrate fracture from too rapid cooldown. The overall firing procedure will preferably extend over a period of about 1 hour, with 20–25 minutes to reach the firing temperature, about 10 minutes at the firing temperature, and about 20–25 minutes in cooldown.

The fired thickness of the gold conductor can range from about 4 to about 25 microns, depending on the percent solids, the type of screen the composition is printed with, the printer setup, and the degree of sintering of the inorganic solids.

Wire bonding is conventionally achieved by bringing the wire into intimate contact with the metallization, followed by application of ultrasound and/or thermal energy to form a bond between the wire and the metallization.

The following examples further illustrate the present invention and also provide a comparison of the performance of the compositions of the present invention with the performance of various compositions that do not contain any silver.

EXAMPLES 1–10

The gold conductor compositions in the present examples were prepared generally as described above. The quantities of each of the ingredients in each of the compositions are specified in Table I following:

TABLE I

| Example | 1 | 2 | 3 | 4 | 5 | 6 | 7 | 8 | 9 | 10 |
|---|---|---|---|---|---|---|---|---|---|---|
| Pt Powder | — | — | — | — | 0.5 | — | — | 0.5 | — | 1.0 |
| Pd Powder | — | — | — | 0.5 | — | — | — | — | 2.50 | — |
| Ag Powder | — | — | — | — | — | 0.5 | 1.0 | 0.5 | — | — |
| Au Powder | 86.0 | 84.0 | 84.0 | 84.0 | 84.0 | 84.0 | 82.0 | 84.0 | 83.50 | 84.0 |
| $Cu_2O$ | 0.25 | 0.25 | 0.50 | 0.22 | 0.24 | 0.25 | 0.24 | 0.25 | 0.25 | 0.25 |
| CdO | 1.00 | 0.75 | 0.75 | 0.72 | 0.72 | 0.75 | 0.72 | 0.75 | 1.00 | 0.75 |
| $PbF_2$ | 1.00 | — | — | — | — | — | — | — | 1.00 | — |
| Glass | 1.25 | — | — | — | — | — | — | — | 1.25 | — |
| $Bi_2O_3$ | — | 1.00 | 1.00 | 1.00 | 1.00 | 1.00 | 1.00 | 1.00 | — | 1.00 |
| Castor Oil | 0.6 | 0.6 | 0.6 | 0.6 | 0.6 | 0.6 | 0.6 | 0.6 | 0.6 | 0.6 |
| Ethyl Cellulose | 0.9 | 1.5 | 1.5 | 1.5 | 1.5 | 1.5 | 1.6 | 1.5 | 0.9 | 1.5 |
| Dibutyl Phthalate | 3.4 | 4.9 | 4.9 | 4.9 | 5.0 | 5.0 | 5.0 | 5.0 | 3.4 | 5.0 |
| Terpineol | 3.4 | 4.9 | 4.9 | 4.9 | 5.0 | 5.0 | 5.0 | 5.0 | 3.4 | 5.0 |
| Dibutyl Carbitol | — | 0.9 | 0.9 | 0.9 | 0.9 | 0.9 | 0.9 | 0.9 | 0.9 | 0.9 |
| Mineral Spirits | 1.9 | 1.0 | 1.0 | 1.0 | 1.0 | 1.0 | 1.0 | 1.0 | 1.0 | 1.0 |
| Soya Lecithin | 0.2 | — | — | — | — | — | — | — | 0.2 | — |
| Shell Ionol ® | — | — | — | — | — | — | — | — | 0.15 | — |

Examples 1 and 9, which were formulated as glass-containing compositions, were prepared generally in accordance with the procedures disclosed in U.S. Pat. No. 4,004,057, mentioned above. The metal powders and the binders were treated with cyanoguanidine wetting agent, as discussed in the general description above.

The viscosities of the gold compositions were about 200–250 pascal-seconds. The wet film thickness was about 40–50 microns. The samples were dried at about 150° C. for about 10 minutes, followed by firing at about 850° C. for about 10 minutes within an overall firing cycle lasting about 1 hour with heat up and cool down. The fired thickness of the resulting metallizations was about 7–11 microns, with a percent of inorganic solids in the unfired compositions of about 84–88%.

The screen used was 325 mesh stainless steel, with 0.0011 inch thick diameter wire. The emulsion backing on the screen which is used to create the pattern for printing with the composition of the present invention was applied to the screen at a thickness of about 0.5 mil. The gap between the screen and the substrate was about 0.6–0.7 mm. A squeegee made from 70 durometer material was used under a squeegee pressure of about 180 grams per centimeter of squeegee length. The degree of sintering achieved was found to be such that the conductivity of the fired metallization was greater than 80% of the theoretical conductivity of an equal volume of solid gold when allowance is made for the volume percent of inorganic binder in the thick film metallizations.

Bond electrical resistance was measured by forming 10 bonds connecting 6 disconnected areas of metallization. Therefore, the resistance reported in the following tables is the total of the resistance of the 10 bonds, plus the resistance of the interconnecting aluminum wire, plus the metallization between the bonds. The initial resistance at the bond represents a relatively small proportion of the measured resistance. Significant increases in measured resistance can be attributed to deterioration of the bond and increase in the actual bond resistance.

Bond strength is measured by exerting force on the wire loop made between two bonds. The force necessary to break the loop and whether the loop broke in the wire or at the wire/metallization interface is recorded. Values are usually the average of 25 replications.

Tables II, III and IV report wire bond data for the various gold formulations printed and fired over Alsimag 614 and 9950 dielectric. The 9950 dielectric is a crystalline filled glass composition supplied by E. I. du Pont de Nemours and Company, Electronic Materials Division. It was applied by screen printing the wet layer about 0.065 mm thick onto an Alsimag 614 substrate with a 200 mesh screen having a 0.015 mm emulsion backing using techniques similar to those previously described for printing the gold conductors. The dielectric was dried 10 minutes at 150° C., then fired for 10 minutes at 850° C., using the same furnace temperature profile as was used in firing the gold conductor compositions. After the dielectric was printed and fired the gold compositions to be tested were printed on the dielectric layer as previously described. The data of Tables II, III and IV are reported for the various formulations before any heat aging, following 250 hours of heat aging at 150° C, and following 1000 hours of heat aging at 150° C., respectively.

TABLE II

| | Initial Data | | | | | |
|---|---|---|---|---|---|---|
| | Over Alsimag 614 | | | Over Dielectric 9950 | | |
| Example | Bond R[1] | Grams Adhesion | Failure Mode | Bond R | Grams Adhesion | Failure Mode |
| 1 | 0.47Ω | 10.9 | 100% wire | 0.47Ω | 9.7 | 100% wire |
| 2 | 0.49Ω | 10.9 | 100% wire | 0.48Ω | 9.8 | 100% wire |
| 3 | 0.48Ω | 9.7 | 100% wire | 0.47Ω | 10.2 | 100% wire |
| 4 | 0.50Ω | 9.8 | 100% wire | 0.50Ω | 10.1 | 100% wire |
| 5 | 0.53Ω | 9.6 | 100% wire | 0.51Ω | 10.1 | 100% wire |
| 6 | 0.56Ω | 9.9 | 100% wire | —[2] | —[2] | —[2] |
| 7 | 0.52Ω | 10.1 | 100% wire | 0.52Ω | 10.0 | 100% wire |
| 8 | 0.59Ω | 10.5 | 100% wire | 0.56Ω | 10.9 | 100% wire |
| 9 | 0.80Ω | 11.6 | 100% wire | —[3] | —[3] | —[3] |
| 10 | 0.60Ω | 11.0 | 100% wire | 0.61Ω | 10.9 | 100% wire |

[1]Resistance of 10 bonds.
[2]Samples accidentally damaged during test.
[3]Not run.

TABLE III

250-Hour Aged Data

| | Over Alsimag 614 | | | Over Dielectric 9950 | | |
|---|---|---|---|---|---|---|
| Example | Bond R[1] | Grams Adhesion | Failure Mode | Bond R | Grams Adhesion | Failure Mode |
| 1 | 4.5Ω | 4.6 | 92% Bond | 3.1Ω | 4.5 | 92% Bond |
| 2 | 0.59Ω | 4.4 | 92% Bond | 1.8 Ω | 3.6 | 96% Bond |
| 3 | 0.48Ω | 5.8 | 100% wire | 0.49Ω | 5.6 | 44% wire |
| 4 | 0.53Ω | 5.6 | 48% wire | 0.94Ω | 5.0 | 92% Bond |
| 5 | 0.52Ω | 6.0 | 100% wire | 0.53Ω | 6.3 | 100% wire |
| 6 | 0.54Ω | 7.0 | 100% wire | —[2] | —[2] | —[2] |
| 7 | 0.52Ω | 6.5 | 100% wire | 0.50Ω | 6.2 | 100% wire |
| 8 | 0.58Ω | 5.8 | 100% wire | 0.54Ω | 6.4 | 100% wire |
| 9 | 0.60Ω | 6.7 | 100% wire | —[3] | —[3] | —[3] |
| 10 | 0.47Ω | 6.0 | 100% wire | 0.72Ω | 6.2 | 87% wire |

[1]Resistance of 10 bonds.
[2]Samples accidentally damaged during test.
[3]Not run.

TABLE IV

1000 Hours Aged and Resistivity Data

| | Over Alsimag 614 | | | Over Dielectric 9950 | | |
|---|---|---|---|---|---|---|
| Example | Bond R[1] | Grams Adhesion | Failure Mode | Bond R | Grams Adhesion | Failure Mode |
| 1 | ∞ | 3.6 | 100% Bond | ∞ | 3.9 | 100% Bond |
| 2 | ∞ | 4.3 | 100% Bond | ∞ | 4.0 | 100% Bond |
| 3 | 0.88Ω | 5.1 | 80% Bond | ∞ | 4.5 | 80% Bond |
| 4 | 1.50Ω | 5.4 | 57% Bond | 16.9Ω | 3.9 | 100% Bond |
| 5 | 0.64Ω | —[2] | —[2] | 0.67Ω | 4.5 | 83% Bond |
| 6 | 0.59Ω | 5.9 | 93% Wire | —[2] | —[2] | —[2] |
| 7 | 0.53Ω | 6.0 | 100% Wire | 0.53Ω | 6.2 | 100% Wire |
| 8 | 0.65Ω | 5.3 | 100% Wire | 0.59Ω | 6.2 | 93% Wire |
| 9 | 0.65Ω | 6.2 | 100% Wire | —[3] | —[3] | —[3] |
| 10 | 0.61Ω | 3.1 | 100% Bond | 0.96Ω | 2.4 | 100% Bond |

[1]Resistance of 10 bonds.
[2]Samples accidentally damaged during test.
[3]Not run.

EXAMPLES 11–14

The gold conductor compositions used in these examples were prepared and made into fired metallizations substantially as described in Examples 1–10 above, except for the identity and quantity of ingredients, which are specified in Table V following:

TABLE V

Formulations - Parts by Weight*

| Example | 11 | 12 | 13 | 14 |
|---|---|---|---|---|
| Gold | 83 | 83 | 83 | 85 |
| Silver | 0.5 | 0.25 | 0.25 | 0.75 |
| Palladium | — | — | 0.5 | — |
| Copper Oxide | 0.25 | 0.25 | 0.25 | 0.25 |
| Cadmium Oxide | 0.75 | 0.75 | 0.75 | 0.75 |
| Bismuth Oxide | 1.00 | 1.00 | 1.00 | 1.00 |
| Triethanolamine | 0.1 | 0.1 | 0.1 | 0.1 |
| Shell Ionol ® | 0.1 | 0.1 | 0.1 | 0.1 |
| Hydrogenated Castor Oil | 0.7 | 0.7 | 0.7 | 0.6 |
| Dibutyl Carbitol | 1.1 | 1.1 | 1.1 | 0.9 |
| Ethyl Cellulose | 1.4 | 1.4 | 1.3 | 1.1 |
| Terpineol | 5.0 | 5.1 | 5.0 | 4.3 |
| Dibutyl Phthalate | 5.1 | 5.2 | 5.0 | 4.3 |
| Mineral Spirits | 1.0 | 1.0 | 1.0 | 0.8 |

*Organic portions rounded to nearest 0.1%.

The resulting bonds were tested substantially as described in Examples 1–10 above, except as indicated in the footnotes in Table VI following:

TABLE VI

Wire Bond Adhesions[1]

| Example | Ag/Pd Levels (%) | Bond R[2] | Grams Adhesion[3] | Failure Mode[4] |
|---|---|---|---|---|
| | | No Thermal Aging | | |
| 11 | 0.5 /0 | 0.62Ω | 9.4 | 100% wire |
| 12 | 0.25/0 | 0.61 | 9.5 | 100% wire |
| 13 | 0.25/0.50 | 0.65 | 10.0 | 100% wire |
| 14 | 0.75/0 | 0.58 | 9.1 | 100% wire |
| | After 250 Hrs. Thermal Aging[5] | | | |
| 11 | 0.5 /0 | 0.60 | 6.2 | 100% wire |
| 12 | 0.25/0 | 0.59 | 6.2 | 100% wire |
| 13 | 0.25/0.50 | 1.20 | 4.5 | 87% wire |
| 14 | 0.75/0 | 0.56 | 6.2 | 100% wire |
| | After 1000 Hrs. Thermal Aging | | | |
| 11 | 0.5 /0 | 1.03 | 5.8 | 90% wire |
| 12 | 0.25/0 | ∞ | 3.8 | 100% bond |
| 13 | 0.25/0.50 | ∞ | 3.8 | 100% bond |
| 14 | 0.75/0 | 0.72 | 6.5 | 90% wire |

[1]Printed over Alsimag 614 alumina.
[2]Average of 10 bonds plus interconnecting conductor.
[3]Average of 20 pulls.
[4]"Wire" means the wire broke; "bond" means the bond lifted from the gold conductor.
[5]Thermal aging in an oven at 150° C.

Industrial Applicability

The gold conductor compositions of the present invention can be used in electronic microcircuits, such as those used in resistor arrays, capacitors, and fine line arrays for connecting silicon chip integrated circuits to terminals. These compositions are particularly useful where aluminum wire interconnectors are used in such circuits.

Best Mode

Although the best mode of the present invention, i.e., the single most preferred composition of the present invention, will depend upon the particular intended end use and the specific requisite combination of properties for that use, the composition presently believed to be most suitable for the widest variety of applications in various microcircuitry environments is substantially as described in Example 14.

I claim:

1. A gold conductor composition suitable for application in thick film microcircuitry consisting essentially of 75–90% by weight of the composition of gold powder, binder selected from the group consisting of copper oxide, cadmium oxide, bismuth oxide and mixtures of two or more of copper oxide, cadmium oxide and bismuth oxide, organic vehicle and 0.1–4% by weight of silver.

2. A composition of claim 1 wherein the silver is metallic silver.

3. A composition of claim 1 wherein the silver is selected from the group consisting of silver resinate and silver oxide.

4. A composition of claim 1 wherein the gold powder comprises 75–90% by weight of the composition, the binder comprises 0.25–5% by weight of the composition, the silver comprises 0.1–4% by weight of the composition, and organic vehicle comprises the remainder of the composition.

5. A composition of claim 1 wherein the organic vehicle is selected from the group consisting of solutions and dispersions of ethyl cellulose, polybutyl methacrylate, poly-α-methylstyrene, poly(ethylene-vinylacetate), and mixtures of two or more of ethyl cellulose, polybutyl methacrylate, poly-α-methylstyrene and poly(ethylene-vinylacetate).

6. A composition of claim 5 wherein the solutions and dispersions also include an additive selected from the group consisting of thixotropes, wetting agents, stabilizers and mixtures of two or more of thixotropes, wetting agents and stabilizers.

7. A composition of claim 4 wherein the gold powder comprises 80–88% by weight of the composition, the binder is one or more metal oxides and comprises 0.3–3% by weight of the composition, the silver comprises 0.25–2% by weight of the composition, and the organic vehicle comprises the remainder of the composition.

8. A composition of claim 7 wherein the gold powder comprises 82–86% by weight of the composition, the binder comprises 1.5–2.5% by weight of the composition, the silver comprises 0.5–1% by weight of the composition, and the organic vehicle comprises the remainder of the composition.

9. A process for making a composition of claim 1 comprising intimately mixing the gold powder, binder, organic vehicle and 0.1–4% by weight of silver.

* * * * *